(12) United States Patent
Takahashi et al.

(10) Patent No.: US 10,978,469 B2
(45) Date of Patent: Apr. 13, 2021

(54) SEMICONDUCTOR STORAGE DEVICE HAVING AN AMORPHOUS LAYER

(71) Applicant: TOSHIBA MEMORY CORPORATION, Tokyo (JP)

(72) Inventors: Kensei Takahashi, Kuwana Mie (JP); Takashi Asano, Yokkaichi Mie (JP); Satoshi Wakatsuki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/287,454

(22) Filed: Feb. 27, 2019

(65) Prior Publication Data

US 2020/0066750 A1 Feb. 27, 2020

(30) Foreign Application Priority Data

Aug. 23, 2018 (JP) .............................. JP2018-156392

(51) Int. Cl.
| | |
|---|---|
| *H01L 27/11582* | (2017.01) |
| *H01L 29/49* | (2006.01) |
| *H01L 29/51* | (2006.01) |
| *H01L 21/285* | (2006.01) |
| *H01L 21/02* | (2006.01) |
| *H01L 21/28* | (2006.01) |
| *H01L 29/04* | (2006.01) |

(Continued)

(52) U.S. Cl.
CPC .. *H01L 27/11582* (2013.01); *H01L 21/02178* (2013.01); *H01L 21/02271* (2013.01); *H01L 21/28556* (2013.01); *H01L 21/28568* (2013.01); *H01L 29/40117* (2019.08); *H01L 29/4966* (2013.01); *H01L 29/517* (2013.01); *H01L 29/04* (2013.01); *H01L 29/1037* (2013.01); *H01L 29/16* (2013.01); *H01L 29/513* (2013.01); *H01L 29/518* (2013.01)

(58) Field of Classification Search
CPC .......... H01L 27/11582; H01L 29/4966; H01L 29/517; H01L 21/28282; H01L 21/02178; H01L 21/02271; H01L 21/28568; H01L 21/28556; H01L 29/04; H01L 21/02; H01L 21/28; H01L 21/285; H01L 29/49; H01L 29/51
USPC ........................................................ 257/751
See application file for complete search history.

(56) References Cited

U.S. PATENT DOCUMENTS

| | | | |
|---|---|---|---|
| 6,022,801 A | 2/2000 | Domenicucci et al. | |
| 6,576,526 B2 * | 6/2003 | Kai ................... | H01L 21/31122 257/E21.009 |

(Continued)

FOREIGN PATENT DOCUMENTS

| | | | | |
|---|---|---|---|---|
| JP | 3224787 B2 | 11/2001 | | |
| JP | 2003-100755 A | * 4/2003 | ......... | H01L 21/3205 |

(Continued)

*Primary Examiner* — Alexander O Williams
(74) *Attorney, Agent, or Firm* — Foley & Lardner LLP (57) ABSTRACT

A semiconductor storage device includes a semiconductor substrate; an insulating layer provided on the semiconductor substrate; a barrier metal layer provided on the insulating layer; an aluminum compound layer provided on the barrier metal layer; an amorphous layer provided on the aluminum compound layer and including a material that vaporizes upon its chemical reaction with fluorine; and a metal layer provided on the amorphous layer.

5 Claims, 6 Drawing Sheets

(51) Int. Cl.
  *H01L 29/16* (2006.01)
  *H01L 29/10* (2006.01)

(56) References Cited

U.S. PATENT DOCUMENTS

| | | |
|---|---|---|
| 8,455,940 B2 | 6/2013 | Lee et al. |
| 2006/0160355 A1* | 7/2006 | Kim .................. H01L 21/76802 |
| | | 438/637 |
| 2006/0166384 A1* | 7/2006 | Tatsumi .................. H01L 22/32 |
| | | 438/17 |
| 2009/0078979 A1* | 3/2009 | Kumura ............ H01L 27/11502 |
| | | 257/295 |
| 2009/0115028 A1* | 5/2009 | Shimomura ...... H01L 21/02686 |
| | | 257/623 |
| 2017/0263640 A1 | 9/2017 | Takashima et al. |

FOREIGN PATENT DOCUMENTS

| | | |
|---|---|---|
| JP | 2003-100755 A | 4/2003 |
| JP | 2003-142577 A | 5/2003 |
| JP | 5858643 B2 | 2/2016 |
| JP | 2017-163108 A | 9/2017 |

* cited by examiner

SEMICONDUCTOR STORAGE DEVICE HAVING AN AMORPHOUS LAYER

This application claims the benefit of and priority to Japanese Patent Application No. 2018-156392, filed Aug. 23, 2018, the entire contents of which are incorporated herein by reference.

FIELD

Embodiments described herein relate generally to a semiconductor storage device and a method for manufacturing the same.

BACKGROUND

A semiconductor storage device manufacturing process may include a process of forming a metal layer using a fluorine-containing gas. In some cases, fluorine reacts with a material contained in a layer underlying the metal layer, and the resulting fluorine compound remains in the underlying layer. In such a case, it is possible that the fluorine may be released in a later heating operation. The diffusion of fluorine can deteriorate the insulation resistance of the underlying layer.

DETAILED DESCRIPTION

Embodiments described herein provide for a semiconductor storage device and a method for manufacturing the same which can enhance a fluorine blocking performance.

In general, according to one embodiment, A semiconductor storage device includes a semiconductor substrate; an insulating layer provided on the semiconductor substrate; a barrier metal layer provided on the insulating layer; an aluminum compound layer provided on the barrier metal layer; an amorphous layer provided on the aluminum compound layer and including a material that vaporizes upon its chemical reaction with fluorine; and a metal layer provided on the amorphous layer.

Embodiments of the present disclosure will be described with reference to the drawings. The explicitly described embodiments are not to be construed as limiting the present disclosure.

Figure 1:
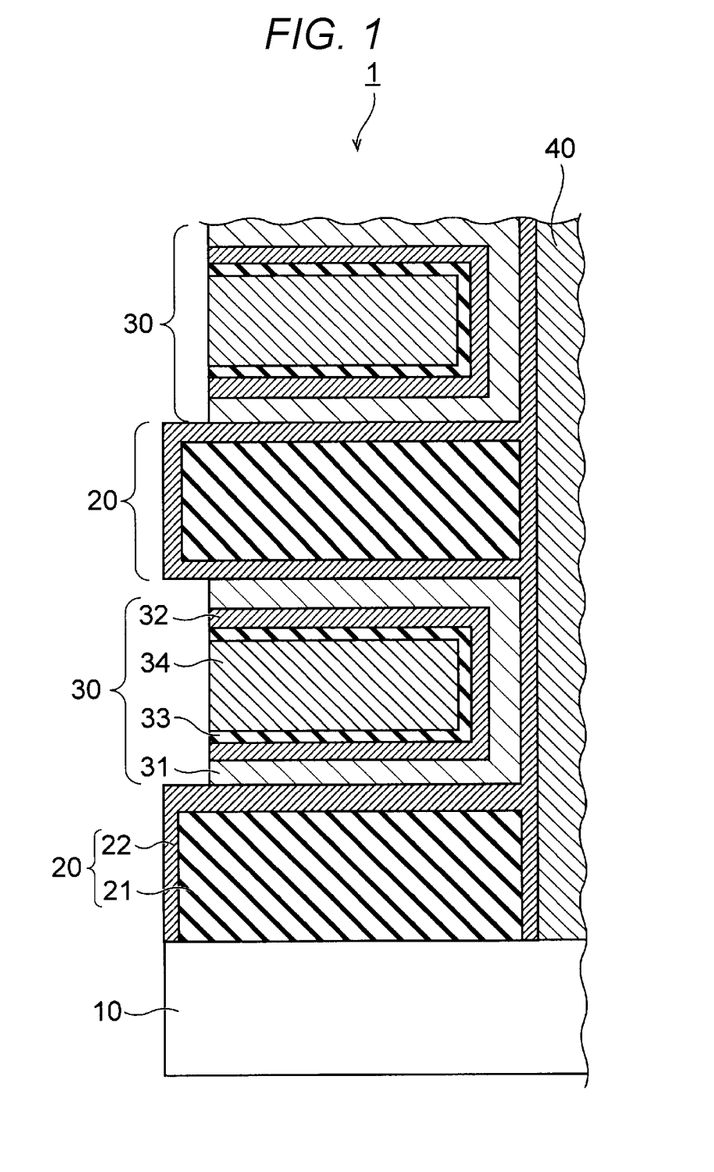
FIG. 1 is a cross-sectional view showing a structure of a main portion of a semiconductor storage device according to an embodiment.

FIG. 1 is a cross-sectional view showing the structure of a main portion of a semiconductor storage device according to an embodiment. A semiconductor storage device 1 shown in FIG. 1 is a three-dimensional semiconductor storage device including a stack of electrode layers (e.g., word lines). The semiconductor storage device 1 includes a semiconductor substrate 10, first films 20, second films 30, and a memory film 40.

The semiconductor substrate 10 is, for example, a silicon substrate. The first films 20 and the second films 30 are alternately stacked on the semiconductor substrate 10. In this embodiment the lowermost first film 20 is in contact with the semiconductor substrate 10; however, another layer, e.g. having an element (e.g., an electric element) and interconnects which are used to drive the memory film 40, may be formed between the semiconductor substrate 10 and the lowermost first film 20.

Each first film 20 includes an insulating layer 21 and a bulk layer 22. The insulating layer 21 includes, for example, a silicon oxide ($SiO_2$) layer. The bulk layer 22 covers the insulating layer 21 and has a higher dielectric constant than that of the insulating layer 21. The bulk layer 22 includes, for example, an aluminum oxide ($Al_2O_3$) layer.

The second films 30 may include substitute films for silicon nitride (SiN) films stacked alternately with the insulating layers 21. Each second film 30 includes a barrier metal layer 31, an aluminum compound layer 32, an amorphous layer 33, and a metal layer 34. The structure of one of the second films 30 will now be described.

Figure 2:
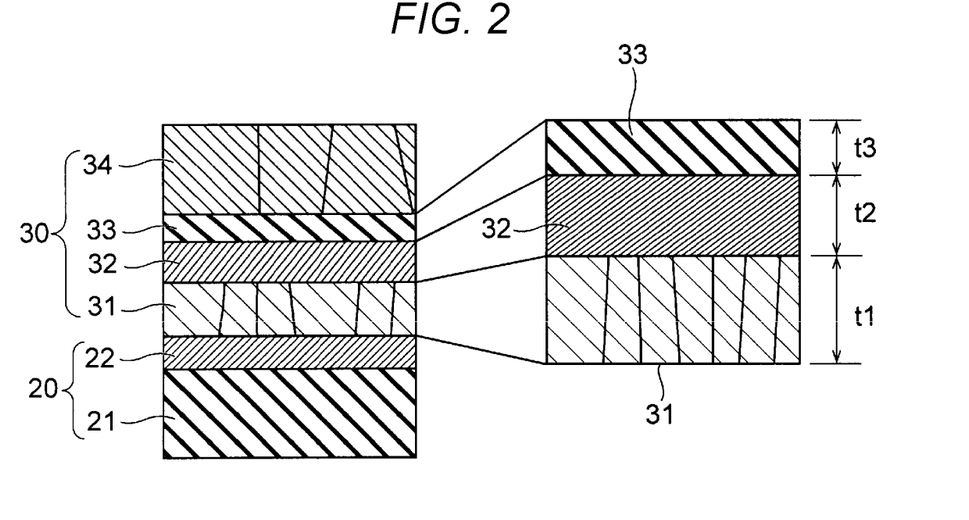
FIG. 2 is an enlarged cross-sectional view of a film according to an embodiment.

FIG. 2 is an enlarged cross-sectional view of the second film 30. As shown in FIG. 2, the barrier metal layer 31 is formed on the bulk layer 22. The barrier metal layer 31 includes for example, a titanium nitride (TiN) layer. The barrier metal layer 31 can help to prevent a metal included in the metal layer 34, for example tungsten (W), from diffusing into the insulating layer 21.

The aluminum compound layer 32 is formed on the barrier metal layer 31. The aluminum compound layer 32 includes, for example, an aluminum oxide layer ($Al_2O_3$) or an aluminum nitride (AlN) layer.

In some cases the barrier metal layer 31 includes a titanium nitride (TiN) layer, and the titanium nitride crystal particles are small. Therefore, if the metal layer 34 including tungsten is formed directly on the barrier metal layer 31, then the tungsten crystal particles may be influenced by the titanium nitride crystal particles and become small. This can result in a high electrical resistance of the metal layer 34.

In the presently described embodiment, the aluminum compound layer 32 is formed between the barrier metal layer 31 and the metal layer 34. The aluminum compound layer 32 functions as a crystal disruption layer and can eliminate or reduce the influence of the crystal particles of the barrier metal layer 31.

On the other hand, when aluminum chemically reacts with fluorine, aluminum fluoride ($AlF_3$), which is not very volatile, is produced. Thus, if the metal layer 34 is formed directly on the aluminum compound layer 32 using a fluorine-containing gas (a gas that includes fluorine), aluminum fluoride is likely to remain in the aluminum compound layer 32. It is, therefore, possible that fluorine may diffuse in a heating operation after the formation of the aluminum compound layer 32, resulting in deterioration of the insulting resistance of the aluminum compound layer 32.

The amorphous layer 33 may be disposed between the aluminum compound layer 32 and the metal layer 34, which can help to mitigate this risk. The amorphous layer 33 includes a material that vaporizes upon its chemical reaction with fluorine. The material includes at least one of boron (B), boron nitride (BN), boron oxide ($B_2O_3$), titanium nitride, titanium oxide ($TiO_2$), and silicon (Si).

Certain compounds of the above-identified materials including fluorine (such as $B_xF_y$, $Ti_xF_y$ and $Si_xF_y$; x and y are integers) have a respective evaporation temperature which is lower than that of aluminum fluoride. Materials that produce fluorides having a low evaporation temperature include materials that have a vapor pressure of 1 mTorr (0.133322 Pa) or less at 400° C. As with the aluminum compound layer 32, the amorphous layer 33 functions as a crystal disruption layer; therefore, the size of the crystal particles of the metal layer 34 is not influenced to a significant degree by the size of the crystal particles of the barrier metal layer 31.

The metal layer 34 is formed on the amorphous layer 33. The metal layer 34 functions as an electrode layer electrically connected to the memory film 40 (e.g., as a word line).

The memory film 40 shown in FIG. 1 is formed in a hole that penetrates the stack of the first films 20 and the second films 30, and accumulates or disperses electric charges based on signals inputted from the metal layers 34. The memory film 40 includes, for example, a stacked film including a channel layer, a tunnel insulating layer, a charge blocking layer, and a charge accumulation layer. The channel layer includes, for example, a polysilicon layer. The charge accumulation layer and the tunnel insulating layer include, for example, silicon oxide layers. The charge accumulation layer includes, for example, a silicon nitride (SiN) layer.

A method for manufacturing the semiconductor storage device 1 according to an embodiment will now be described with reference to FIGS. 3 through 6. A manufacturing method for the second films 30 is described herein.

Figure 3:
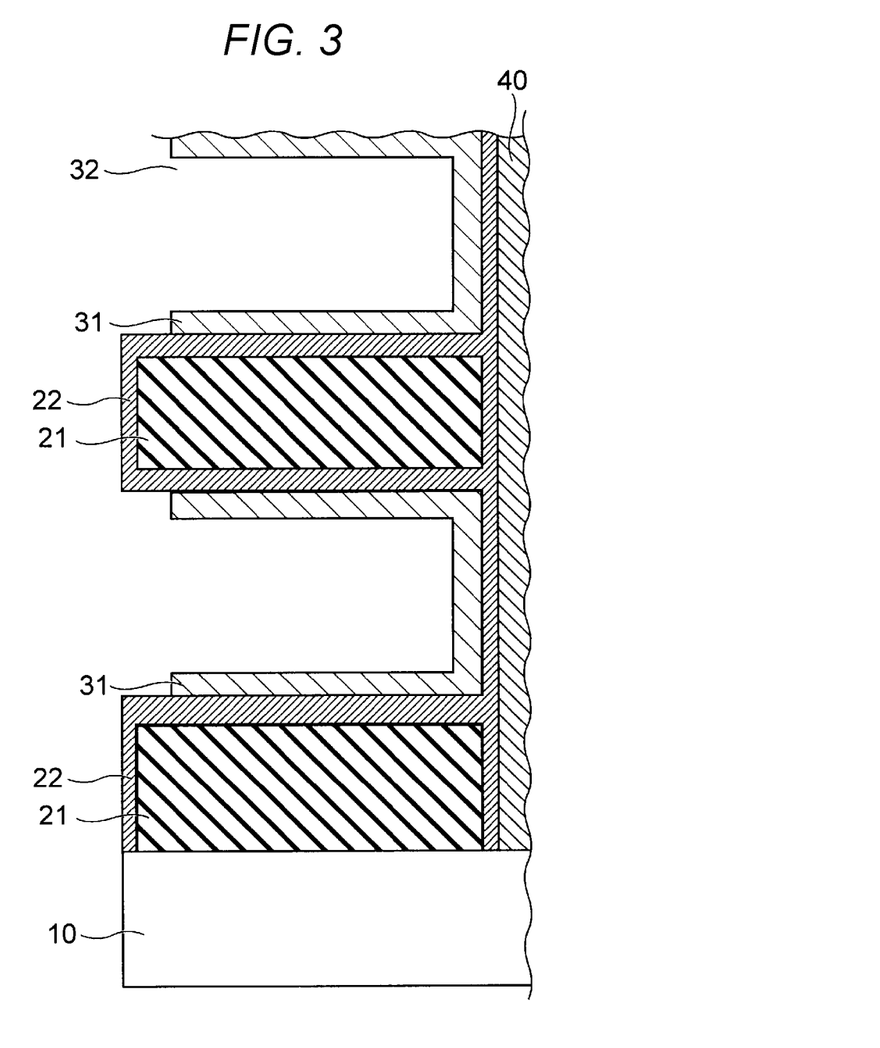
FIG. 3 is a cross-sectional view illustrating a barrier metal layer forming operation according to an embodiment.

First, as shown in FIG. 3, barrier metal layers 31 are formed on insulating layers 21 covered with bulk layers 22. The barrier metal layers 31 may be formed by using, for example, a CVD (Chemical Vapor Deposition) method or an ALD (Atomic Layer Deposition) method. In this embodiment, the thickness t1 (see FIG. 2) of each barrier metal layer 31 is about 2 nanometers (nm).

Figure 4:
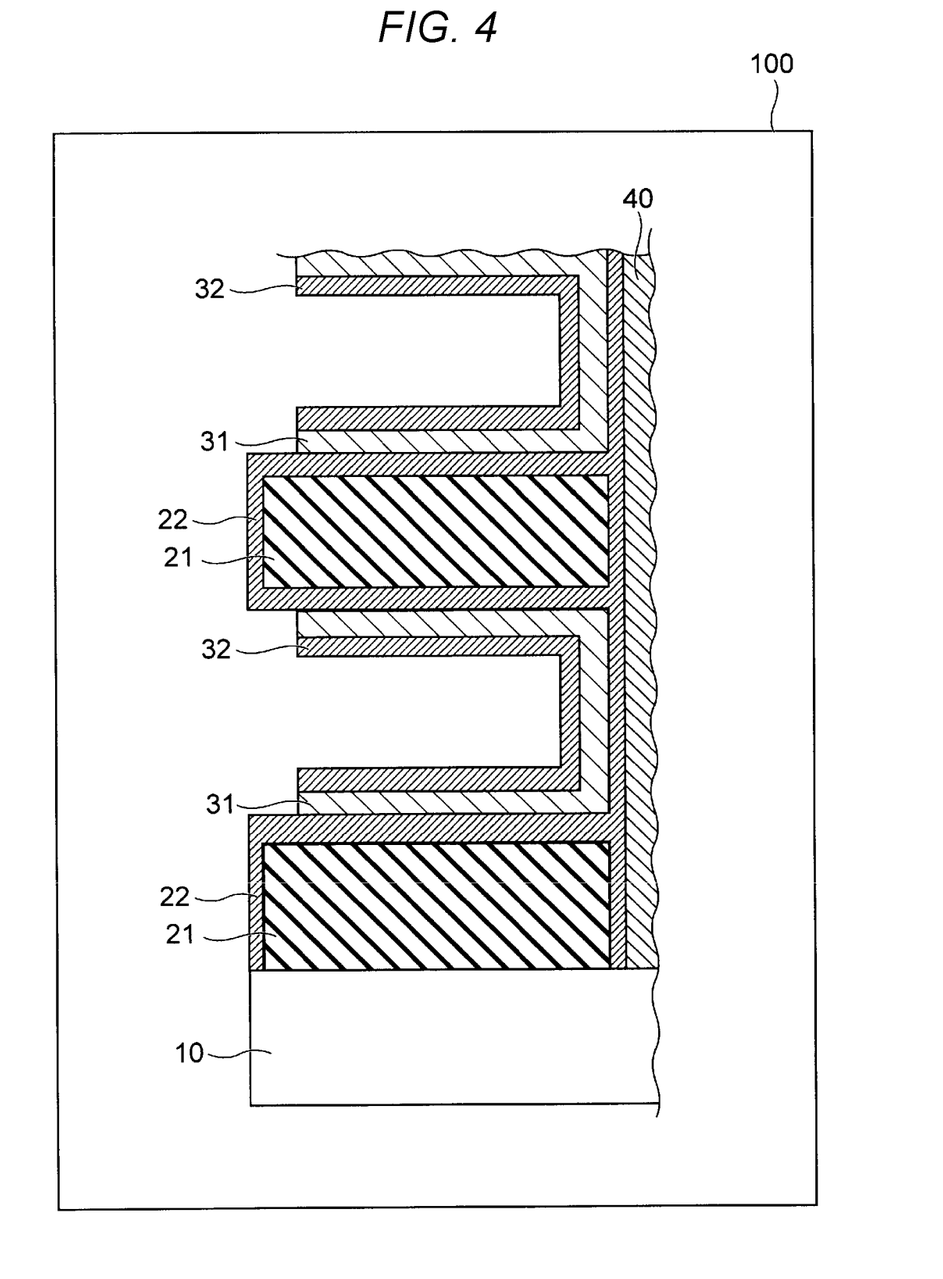
FIG. 4 is a cross-sectional view illustrating an aluminum compound layer forming operation according to an embodiment.

Next, as shown in FIG. 4, an aluminum compound layer 32 is formed on each barrier metal layer 31. The aluminum compound layer 32 may be formed in a vacuum condition in a chamber 100 by using a CVD method or an ALD method. In this embodiment, the pressure in the chamber 100 is lower than 10 Torr (1333.22 Pa), and the thickness t2 (see FIG. 2) of the aluminum compound layer 32 is in the range of about 1.3 to about 1.5 nm.

Figure 5:
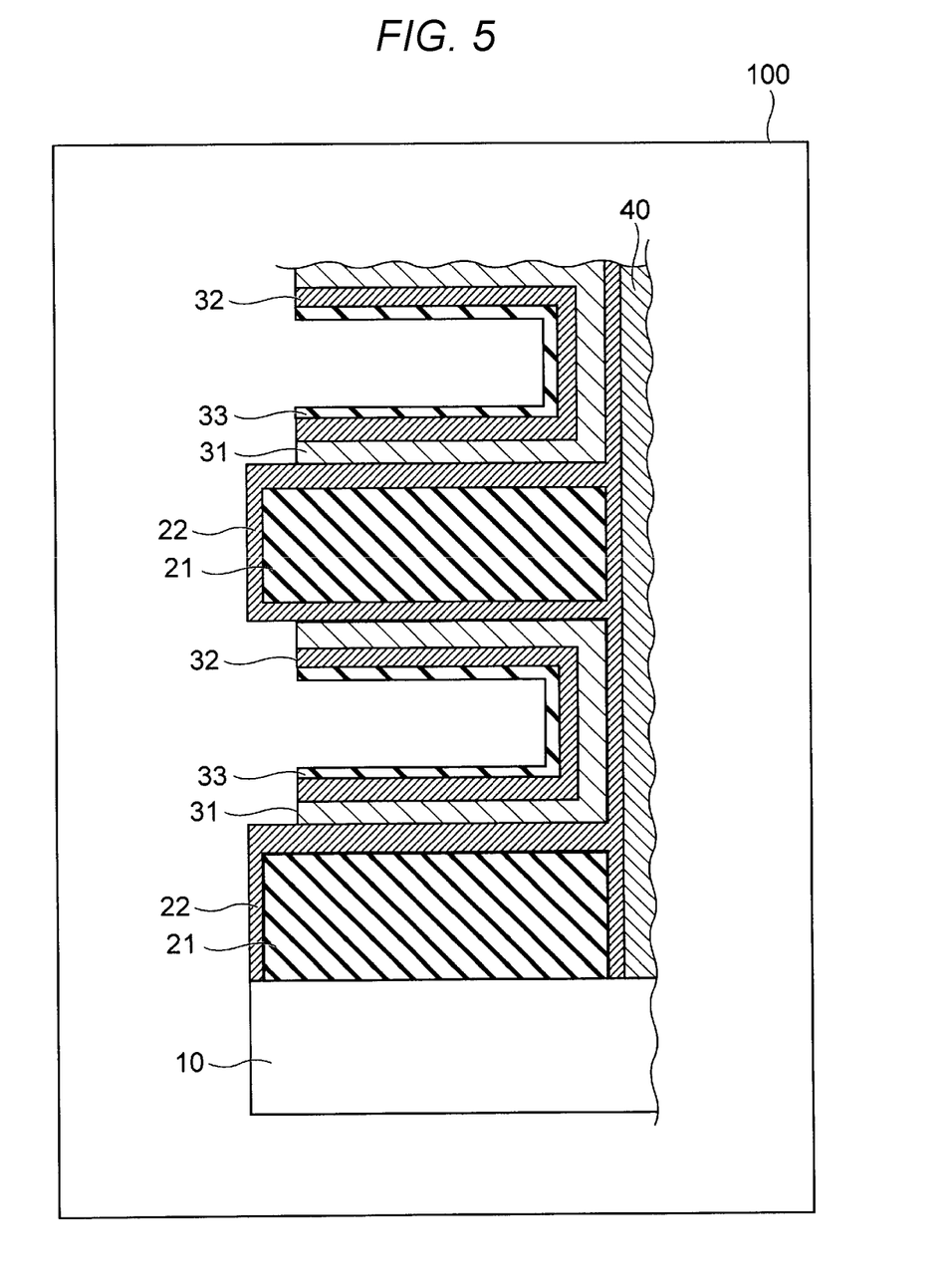
FIG. 5 is a cross-sectional view illustrating an amorphous layer forming operation according to an embodiment.

Next, as shown in FIG. 5, an amorphous layer 33 is formed on the aluminum compound layer 32. The amorphous layer 33 may be formed by using a CVD method or an ALD method. In this embodiment, the amorphous layer 33 is formed in the same chamber 100 subsequent to the formation of the aluminum compound layer 32. During the formation of these layers, the oxygen concentration in the chamber 100 is lower than about 1 ppm. By thus forming the aluminum compound layer 32 and the amorphous layer 33 successively in the chamber 100 of low oxygen concentration, oxidation of the aluminum compound layer 32 is prevented or reduced. Accordingly, the heat resistance of the aluminum compound layer 32 can be enhanced.

Next, a metal layer 34 is formed on the amorphous layer 33. The metal layer 34 may be formed by using a CVD method or an ALD method. The metal layer 34 may be formed by using, for example, a material gas including tungsten and a reducing gas such as hydrogen gas.

Figure 6:
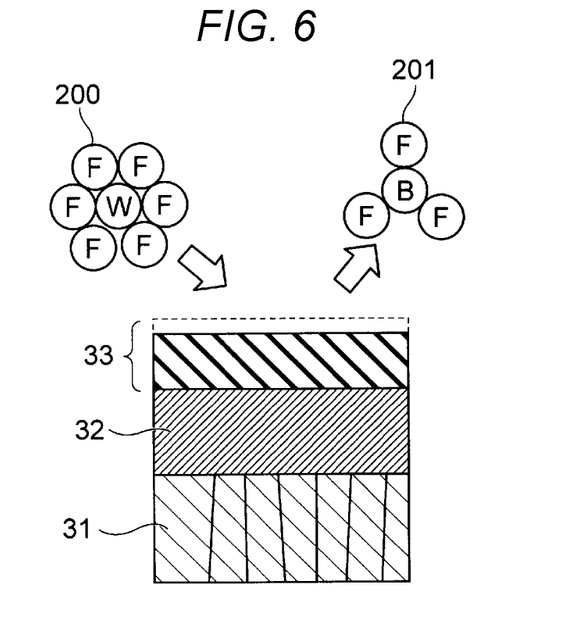
FIG. 6 is a cross-sectional view illustrating a metal layer forming operation according to an embodiment.

In this embodiment, as shown in FIG. 6, tungsten hexafluoride ($WF_6$) gas 200 is used as the material gas. When, for example, the amorphous layer 33 includes boron, boron fluoride ($BF_3$) 201 is produced as a fluoride upon the supply of tungsten hexafluoride gas 200.

Boron fluoride 201 is volatile, and therefore is unlikely to remain in the surface of the amorphous layer 33. As the boron fluoride vaporizes, the amorphous layer 33 is etched. Accordingly, the thickness t3 (see FIG. 2) of the amorphous layer 33 eventually becomes smaller than the thickness t2 (see FIG. 2) of the aluminum compound layer 32. In this embodiment the thickness t3 is about 1 nm.

According to the above-described embodiment, the amorphous layer 33 includes a material that vaporizes upon or subsequent to its chemical reaction with fluorine. Therefore, even when a fluorine-containing material gas is used upon the formation of the metal layer 34, fluorine is unlikely to remain in the amorphous layer 33. This can enhance the fluorine blocking performance.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component can encompass cases where the former component is directly on (e.g., in physical contact with) the latter component, as well as cases where one or more intervening components, or a space, are located between the former component and the latter component.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device comprising:
   a semiconductor substrate;
   an insulating layer provided on the semiconductor substrate;
   a barrier metal layer provided on the insulating layer;
   an aluminum compound layer provided on the barrier metal layer;
   an amorphous layer provided on the aluminum compound layer and comprising a material that vaporizes upon its chemical reaction with fluorine; and
   a metal layer provided on the amorphous layer,
   wherein a thickness of the amorphous layer is smaller than a thickness of the aluminum compound layer.

2. The semiconductor storage device according to claim 1, wherein the material is at least one of boron (B), boron nitride (BN), boron oxide ($B_2O_3$), titanium nitride (TiN), titanium oxide ($TiO_2$), and silicon (Si).

3. The semiconductor storage device according to claim 1, wherein the aluminum compound layer is an aluminum oxide ($Al_2O_3$) layer or an aluminum nitride (AlN) layer.

4. A semiconductor storage device comprising:
a semiconductor substrate;
an insulating layer provided on the semiconductor substrate;
a barrier metal layer provided on the insulating layer;
an aluminum compound layer provided on the barrier metal layer;
an amorphous layer provided on the aluminum compound layer and comprising a material that vaporizes upon its chemical reaction with fluorine;
a metal layer provided on the amorphous layer;
a plurality of insulating layers including the insulating layer;
a plurality of first films respectively including the insulating layers;
a plurality of barrier metal layers including the barrier metal layer, a plurality of aluminum compound layers including the aluminum compound layer, and a plurality of amorphous layers including the amorphous layer; and
a plurality of second films each including a respective one of the plurality of barrier metal layers, a respective one of the plurality of aluminum compound layers, and a respective one of the plurality of amorphous layers,
wherein the first films and the second films are stacked alternately,
wherein the first films each include a respective bulk layer that covers the corresponding insulating layer and has a higher dielectric constant than that of the insulating layer.

5. A semiconductor storage device comprising:
a semiconductor substrate;
an insulating layer provided on the semiconductor substrate;
a barrier metal layer provided on the insulating layer;
an aluminum compound layer provided on the barrier metal layer;
an amorphous layer provided on the aluminum compound layer and comprising a material that vaporizes upon its chemical reaction with fluorine;
a metal layer provided on the amorphous layer;
a plurality of insulating layers including the insulating layer;
a plurality of first films respectively including the insulating layers;
a plurality of barrier metal layers including the barrier metal layer, a plurality of aluminum compound layers including the aluminum compound layer, and a plurality of amorphous layers including the amorphous layer, and
a plurality of second films each including a respective one of the plurality of barrier metal layers, a respective one of the plurality of aluminum compound layers, and a respective one of the plurality of amorphous layers,
wherein the first films and the second films are stacked alternately,
wherein the first films and the second films are penetrated by a hole, and the semiconductor storage device further comprises a memory film disposed in the hole.

* * * * *